United States Patent
Chang et al.

(10) Patent No.: US 6,851,168 B2
(45) Date of Patent: Feb. 8, 2005

(54) COLLAR REMOVING CLAMP FOR HDP CHAMBER

(75) Inventors: Wen-Shan Chang, Fengshan (TW); Jung-Chang Chen, Hsinchu (TW); Shih-Chang Hsu, Hsinchu (TW); Li-Chung Wang, Taipei (TW); Cheng-Chia Kuo, Hsinchu (TW); Jong-Min Lin, Hsinchu (TW); Kuo-Ming Yu, Changhua (TW); Da-Hsiang Chou, Hsinchu (TW); Kuo-Chuan Chen, Changhua (TW); Ming-Te Chen, Hsinchu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 243 days.

(21) Appl. No.: 10/174,932

(22) Filed: Jun. 19, 2002

(65) Prior Publication Data

US 2003/0233746 A1 Dec. 25, 2003

(51) Int. Cl.$^7$ .......................... B23P 19/00; B23P 19/04
(52) U.S. Cl. ................ 29/426.5; 29/402.03; 29/402.08; 29/256; 29/266; 269/167; 269/218; 269/238
(58) Field of Search .................... 29/402.02, 402.03, 29/402.08, 426.5, 256, 266, 270, 278, 283; 403/43, 44; 269/166, 167, 168, 218, 238, 274, 282

(56) References Cited

U.S. PATENT DOCUMENTS

| | | | | |
|---|---|---|---|---|
| 442,733 A | * | 12/1890 | Shampel | 269/88 |
| 710,544 A | * | 10/1902 | Wandell | 269/238 |
| 848,036 A | * | 3/1907 | Kruger | 269/156 |
| 876,908 A | * | 1/1908 | Ljunglof | 269/157 |
| 996,244 A | * | 6/1911 | Hess | 269/204 |
| 1,954,548 A | * | 4/1934 | Thrasher | 269/129 |
| 2,734,409 A | * | 2/1956 | Schum et al. | 269/78 |
| 2,886,080 A | * | 5/1959 | Rappeport | 269/87.3 |
| 3,051,444 A | * | 8/1962 | Stephenson | 254/231 |
| 3,675,916 A | * | 7/1972 | Kartasuk et al. | 269/69 |
| 3,909,889 A | * | 10/1975 | Emerson | 24/514 |
| 4,669,170 A | * | 6/1987 | Blake | 29/434 |
| 4,750,662 A | * | 6/1988 | Kagimoto | 228/44.5 |
| 4,753,425 A | * | 6/1988 | Yang | 269/45 |
| 6,152,435 A | * | 11/2000 | Snell | 269/43 |

* cited by examiner

*Primary Examiner*—David P. Bryant
(74) *Attorney, Agent, or Firm*—Tung & Associates

(57) ABSTRACT

A clamp for quickly, effectively and safely removing a cathode collar from an HDP deposition chamber for routine maintenance, cleaning or replacement of the collar. The clamp includes a pair of clamp plates which are capable of pivoting movement on respective ends of a connecting rod. A clamp shoe for gripping a corresponding edge of the annular collar is provided on the bottom end of each clamp plate, and a turnbuckle is fitted with a pair of threaded shafts which engage the upper end portions of the respective clamp plates. By rotating the turnbuckle, the threaded shafts are advanced away from each other against the clamp plates, which pivot on the connecting rod and cause the clamp shoes to tightly engage respective edges of the collar. The clamp is grasped to lift the collar from the chamber and replace the collar in the chamber after cleaning or maintenance.

14 Claims, 3 Drawing Sheets

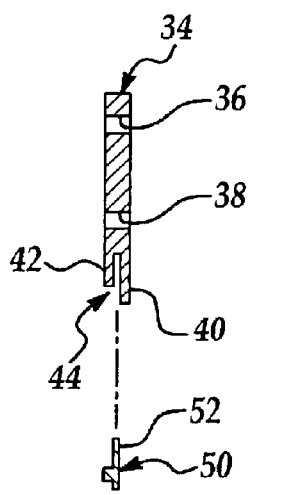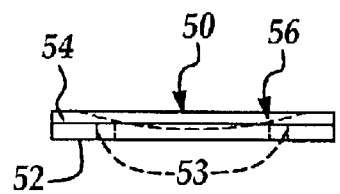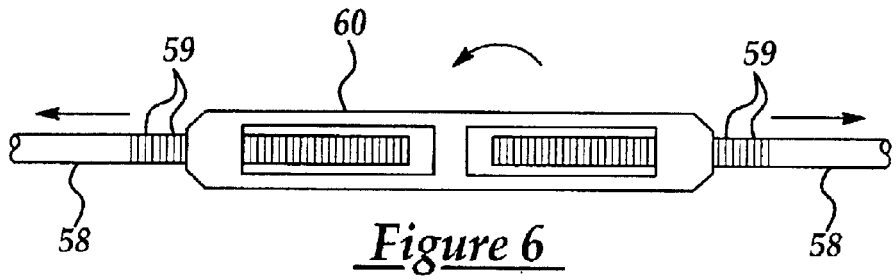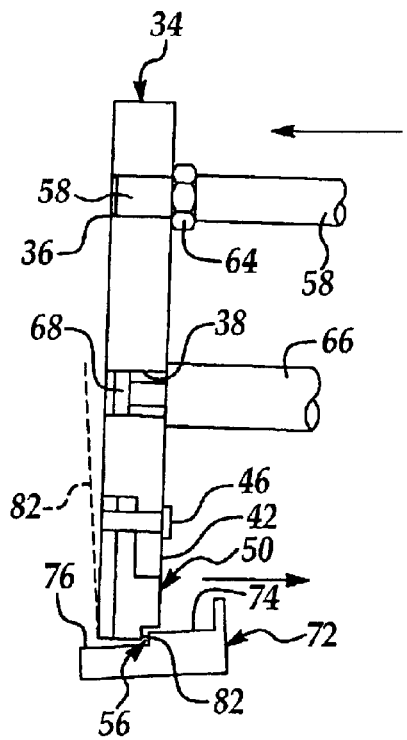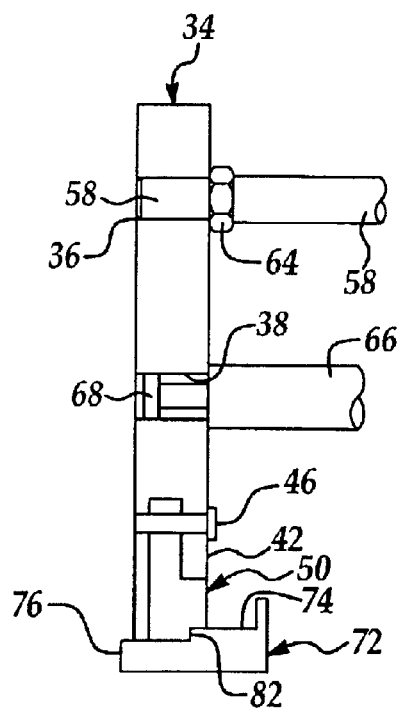

COLLAR REMOVING CLAMP FOR HDP CHAMBER

FIELD OF THE INVENTION

The present invention relates to high-density plasma (HDP) deposition chambers used in the deposition of conductive and resistive layers on a semiconductor wafer substrate. More particularly, the present invention relates to a clamp for quickly and easily removing a cathode collar from an HDP deposition chamber for cleaning and replacing the cathode collar in the chamber.

BACKGROUND OF THE INVENTION

In the semiconductor production industry, various processing steps are used to fabricate integrated circuits on a semiconductor wafer. These steps include the deposition of layers of different materials including metallization layers, passivation layers and insulation layers on the wafer substrate, as well as photoresist stripping and sidewall passivation polymer layer removal. In modern memory devices, for example, multiple layers of metal conductors are required for providing a multi-layer metal interconnection structure in defining a circuit on the wafer. Chemical vapor deposition (CVD) processes are widely used to form layers of materials on a semiconductor wafer.

CVD processes include thermal deposition processes, in which a gas is reacted with the heated surface of a semiconductor wafer substrate, as well as plasma-enhanced CVD processes, in which a gas is subjected to electromagnetic energy in order to transform the gas into a more reactive plasma. Forming a plasma can lower the temperature required to deposit a layer on the wafer substrate, to increase the rate of layer deposition, or both. However, in plasma process chambers used to carry out these various CVD processes, materials such as polymers are coated onto the chamber walls and other interior chamber components and surfaces during the processes. These polymer coatings frequently generate particles which inadvertently become dislodged from the surfaces and contaminate the wafers.

In semiconductor production, the quality of the integrated circuits on the semiconductor wafer is directly correlated with the purity of the fabricating processes, which in turn depends upon the cleanliness of the manufacturing environment. Furthermore, technological advances in recent years in the increasing miniaturization of semiconductor circuits necessitate correspondingly stringent control of impurities and contaminants in the plasma process chamber. When the circuits on a wafer are submicron in size, the smallest quantity of contaminants can significantly reduce the yield of the wafers. For instance, the presence of particles during deposition or etching of thin films can cause voids, dislocations, or short-circuits which adversely affect performance and reliability of the devices constructed with the circuits.

Particle and film contamination has been significantly reduced in the semiconductor industry by improving the quality of clean rooms, by using automated equipment designed to handle semiconductor substrates, and by improving techniques used to clean the substrate surfaces. However, as deposit of material on the interior surfaces of the processing chamber remains a problem, various techniques for in-situ cleaning of process chambers have been developed in recent years. Cleaning gases such as nitrogen trifluoride, chlorine trifluoride, hexafluoroethane, sulfur hexafluoride and carbon tetrafluoride and mixtures thereof have been used in various cleaning applications. These gases are introduced into a process chamber at a predetermined temperature and pressure for a desirable length of time to clean the surfaces inside a process chamber. However, these cleaning techniques are not always effective in cleaning or dislodging all the film and particle contaminants coated on the chamber walls and interior chamber components. The smallest quantity of contaminants remaining in the chamber after such cleaning processes can cause significant problems in subsequent manufacturing cycles.

A typical conventional HDP deposition chamber manufactured by the Applied Materials Corp. of Santa Clara, Calif. is generally indicated by reference numeral 10 in FIG. 1. The HDP chamber 10 includes a base 12 having a chamber interior 14. A lid 13 hingedly attached to the base 12 selectively closes the chamber interior 14. An electrostatic chuck 18 inside the chamber interior 14 supports a cathode 20 on which a wafer substrated (not illustrated) is placed during the HDP deposition process. A typically ceramic cathode collar 22 shields the cathode 20 from damage by RF energy during the process.

As illustrated in FIG. 2, the cathode collar 22 typically includes an annular body 24, having an outwardly-extending rim 26 and an upwardly-extending flange 28. During the plasma deposition process, high-density deposition plasma forms material residues 27 on the cathode collar 22. These residues 27 must be removed from the cathode collar 22 during periodic maintenance of the HDP chamber 10 in order to prevent particle contamination of wafers subsequently processed in the chamber interior 14. Effective removal of the residues 27 from the cathode collar 22 requires that the cathode collar 22 be removed from the HDP chamber 10, cleaned and then replaced in the HDP chamber 10 during each periodic maintenance.

Conventional techniques for removing the cathode collar 22 from the HDP chamber 10 include grasping the cathode collar 22 with the fingers and manually lifting the collar 22 from the chamber 10. However, since the interior chamber walls 16 and the collar 22 are typically maintained at a temperature of about 70 degrees C., these elements present uncomfortably hot surfaces to the fingers and hands of personnel lifting the collar 22 from the chamber 10. Furthermore, the cathode collar 22 must typically be grasped at the body edge 25, which presents an inadequate height of just 2 mm to the fingers of the personnel while grasping and lifting the collar 22 from the chamber 10. Makeshift tools (not illustrated) not designed for the purpose have also been used in attempts to remove the collar 22. These tools usually apply excessive pressure to one or a small number of points on the collar 22 in the lifting process, and the excessive pressure tends to crack or damage the ceramic collar 22.

Accordingly, an object of the present invention is to provide a clamp for quickly, easily and safely removing a cathode collar from a HDP deposition chamber and replacing the collar in the chamber for cleaning, replacement or maintenance purposes.

Another object of the present invention is to provide a collar-removing clamp which is simple in construction and operation.

Still another object of the present invention is to provide a collar-removing clamp which saves time during preventative maintenance of an HDP deposition chamber.

Another object of the present invention is to provide a collar-removing clamp which is effective in removing a cathode collar from an HDP deposition chamber, which clamp is characterized by low risk of damaging the collar.

Yet another object of the present invention is to provide a collar-removing clamp which applies substantially equal pressure to opposite sides of a cathode collar during the removal of the collar from an HDP deposition chamber.

Another object of the present invention is to provide a collar-removing clamp which applies pressure to a relatively large area on a cathode collar to prevent excessive pressure application to a small area or areas on the collar and prevent damage to the collar.

A still further object of the present invention is to provide a collar-removing clamp which prevents cracking or damage to a cathode collar by preventing application of excessive pressure to a particular area or areas on the collar as the collar is removed from an HDP deposition chamber.

SUMMARY OF THE INVENTION

In accordance with these and other objects and advantages, the present invention comprises a clamp for quickly, effectively and safely removing a cathode collar from an HDP deposition chamber for routine maintenance, cleaning or replacement of the collar. The clamp of the present invention includes a pair of clamp plates which are capable of pivoting movement on respective ends of a connecting rod. A clamp shoe for gripping a corresponding edge of the annular collar is provided on the bottom end of each clamp plate, and a turnbuckle is fitted with a pair of threaded shafts which engage the upper end portions of the respective clamp plates. By rotating the turnbuckle, the threaded shafts are advanced away from each other against the clamp plates, which pivot on the connecting rod and cause the clamp shoes to tightly engage respective edges of the collar. The clamp is grasped to lift the collar from the chamber and replace the collar in the chamber after cleaning or maintenance.

BRIEF DESCRIPTION OF THE DRAWINGS

The invention will now be described, by way of example, with reference to the accompanying drawings, in which:

FIG. 4 is a sectional view, taken along section lines 4—4 in FIG. 3, of the clamp plate and clamp shoe elements of the present invention;

FIG. 5 is a top view of a clamp shoe element of the present invention;

FIG. 6 is a top view of a turnbuckle component of the present invention, with threaded shafts (in section) extending from respective ends of the turnbuckle and more particularly illustrating advancing of the shafts from the turnbuckle by rotation of the turnbuckle;

FIG. 7 is a sectional view of one of a pair of clamp plates in implementation of the present invention, with the clamp plate disengaged from the cathode collar;

FIG. 8 is a sectional view of one of a pair of clamp plates in implementation of the present invention, with the clamp plate engaging a corresponding side of the cathode collar for lifting of the collar from an HDP chamber (not shown);

DESCRIPTION OF THE PREFERRED EMBODIMENTS

Figure 1:
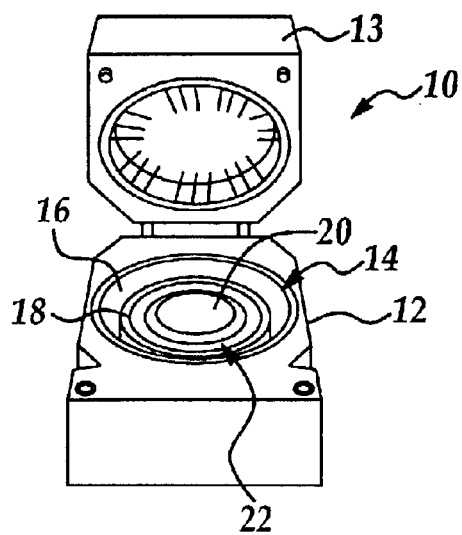
FIG. 1 is a front perspective view of a typical conventional high density plasma (HDP) deposition chamber.
Figure 2:
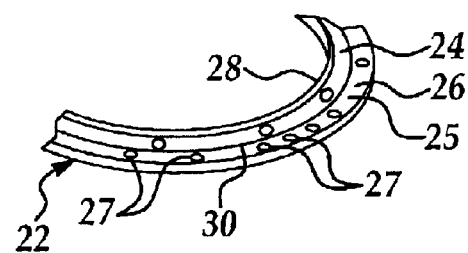
FIG. 2 is a perspective view of a conventional cathode collar, partially in section, of an HDP deposition chamber.
Figure 3:
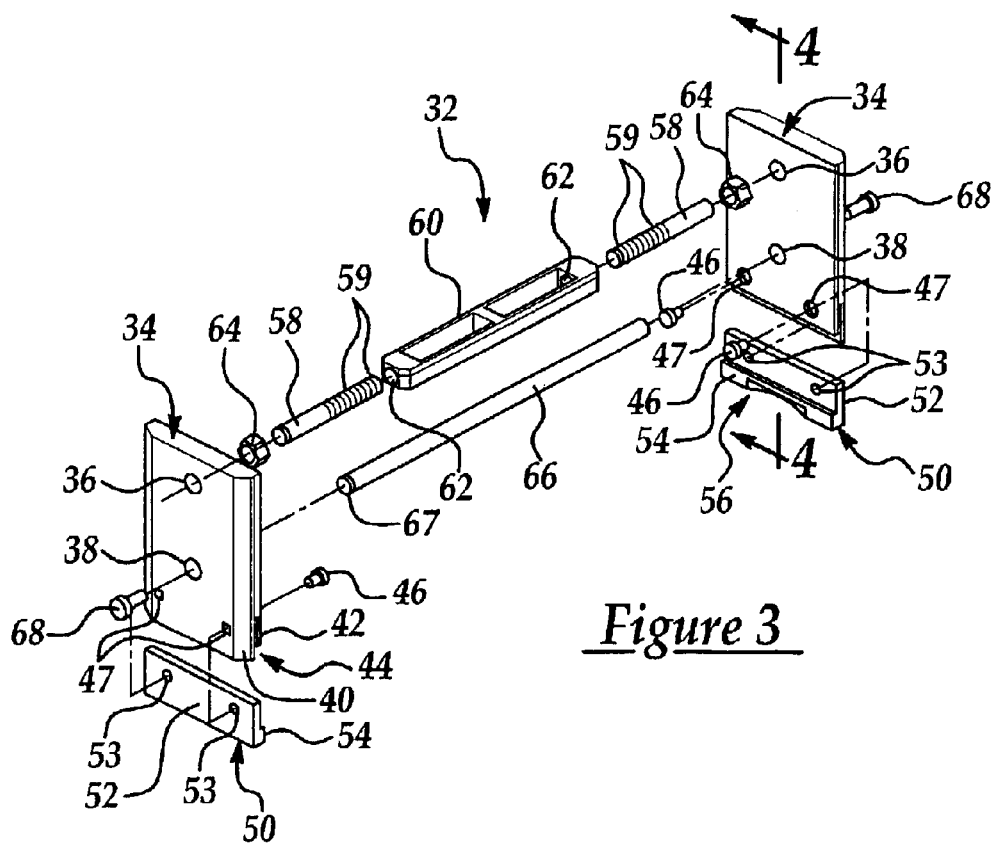
FIG. 3 is an exploded, perspective view of an illustrative embodiment of the collar-removing clamp of the present invention.

The present invention has particularly beneficial utility in the gripping and lifting of cathode collars from HDP deposition chambers used in the processing of semiconductors. However, the invention is not so limited in application, and while references may be made to such cathode collars and HDP deposition chambers, the invention may be applicable to grasping and removing articles in a variety of industrial and product applications.

Referring to FIGS. 3–8, an illustrative embodiment of the collar removing clamp of the present invention is generally indicated by reference numeral 32 and includes a pair of clamp plates 34, each of which is provided with an upper, shaft opening 36 and a lower, bolt opening 38 extending therethrough. As particularly illustrated in FIG. 4, the bottom end of each clamp plate 34 includes a rear plate flange 40 and a typically shorter front plate flange 42, separated from each other by a plate channel 44. A pair of screw openings 47 (FIG. 3) extends through the rear plate flange 40 and the front plate flange 42 for purposes hereinafter described.

A clamp shoe 50 is mounted on the bottom end of each clamp plate 34 and includes a generally elongated, rectangular shoe plate 52, provided with a pair of spaced-apart screw openings 53. A shoe ridge 54 may be formed along the bottom longitudinal edge of the shoe plate 52, and a generally curved or accurate groove 56 may be provided in the shoe ridge 54. The shoe ridge 54 or the entire clamp shoe 50 may be constructed of polytetrafluorethylene, or Teflon®. Each clamp shoe 50 is mounted on the bottom end of the corresponding clamp plate 34 typically by extending the clamp plate 52 into the plate channel 44, as illustrated in FIG. 4, and threading shoe attachment screws 46 through the respective screw openings 47 in the clamp plate 34 and through the registering screw openings 53 in the screw plate 52. Alternatively, the clamp shoe 50 may be formed integrally with or otherwise attached to the clamp plate 34 according to techniques known by those skilled in the art.

Each clamp plate 34 is mounted on the corresponding end of an elongated connecting rod 66, and a rod attachment bolt 68 is seated in the bolt opening 38 of each clamp plate 34 and is threaded into a bolt opening 67 in the corresponding end of the rod 66. As illustrated in FIGS. 7 and 8, each clamp plate 34 is capable of pivoting slightly on the corresponding rod attachment bolt 68, in and out of a generally vertical plane 82. It is understood that a shoulder (not illustrated) may be provided in each bolt opening 38 to prevent the rod attachment bolt 68 from slipping out of the bolt opening 38. It is further understood that various other techniques known by those skilled in the art may be used to mount the clamp plates 34 on the connecting rod 66 in such a manner that the clamp plates 34 are capable of pivoting movement on the connecting rod 66.

An elongated threaded shaft 58, having shaft threads 59, extends from each end of a turnbuckle 60, and the extending end of each shaft 58 is typically friction-fitted in the shaft opening 36 of a corresponding clamp plate 34, as shown in FIGS. 7 and 8. Each clamp plate 34 is capable of slight pivoting movement on the corresponding shaft 58 as the clamp plate 34 pivots on the rod attachment bolt 68 in and out of the vertical plane 82, as further illustrated in FIGS. 7 and 8. Alternative techniques known by those skilled in the art may be used to attach each shaft 58 to the corresponding clamp plate 34 in such a manner that the clamp plate 34 is capable of pivoting movement with respect to the shaft 58. The shaft threads 59 of each shaft 58 threadibly engage companion threads (not illustrated) in each shaft opening 62 (FIG. 3) in the corresponding end of the turnbuckle 60. A shaft nut 64 is provided on each shaft 58 adjacent to the inside face of each corresponding clamp plate 34. Accordingly, as illustrated in FIG. 6, by typically counterclockwise rotation of the turnbuckle 60, each shaft 58 is threadibly advanced outwardly from the corresponding end of the turnbuckle 60, as indicated by the straight arrows. Each outwardly-advancing shaft 58 causes the shaft nut 64 thereon to push outwardly against the inside face of the corresponding clamp plate 34, and this action shifts or pivots the clamp plate 34 on the corresponding rod attachment bolt 68, from the slightly angled position of FIG. 7 to the substantially vertical position of FIG. 8. Conversely, by clockwise rotation of the turnbuckle 60, each shaft 58 is retracted into the corresponding end of the turnbuckle 60, wherein each shaft nut 64 releases the corresponding clamp plate 34 and the clamp plate 34 is capable of assuming the slightly angled position of FIG. 7.

Figure 9:
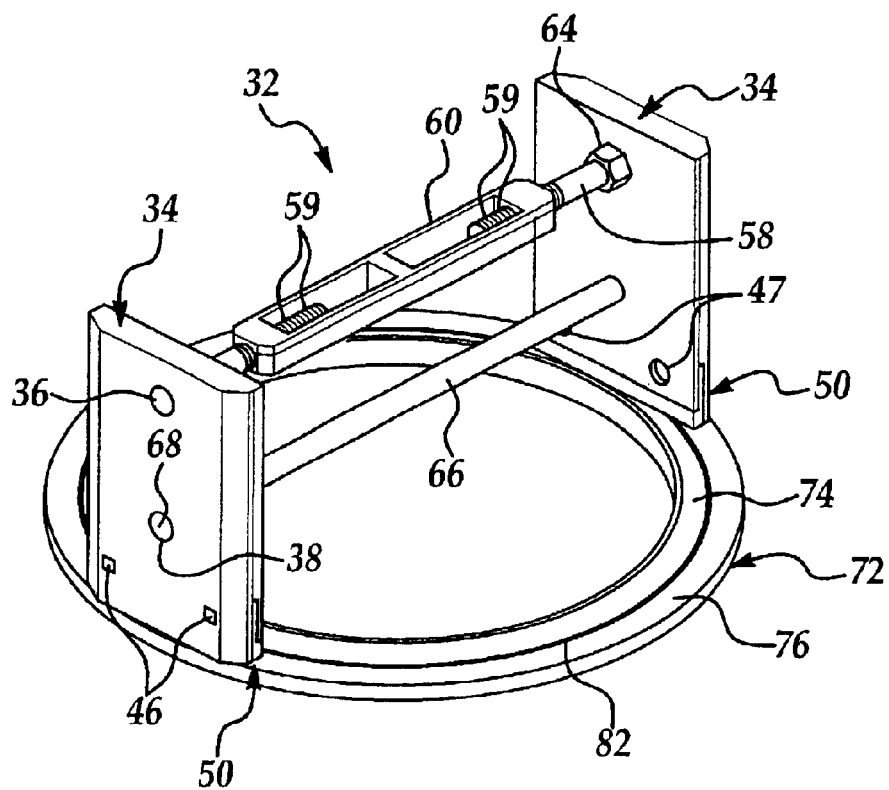
FIG. 9 is a perspective view of the present invention, with the clamp plates engaging respective edges of a cathode collar for lifting of the collar from an HDP chamber (not shown)
Figure 10:
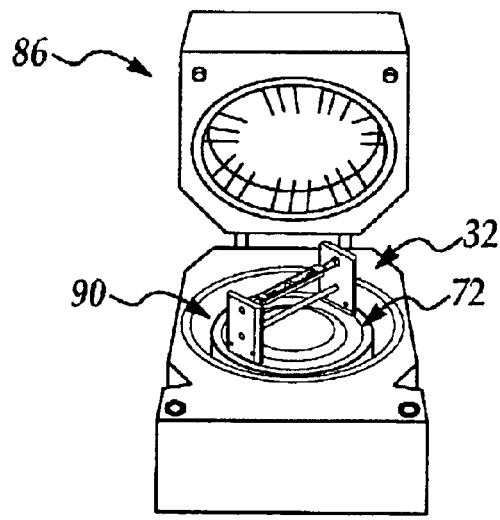
FIG. 10 is a perspective view of an HDP deposition chamber, in typical implementation of the present invention.

Referring next to FIGS. 6–10, in typical application the clamp 32 of the present invention may be used to remove a cathode collar 72 from the interior 90 of a conventional HDP deposition chamber 86 (FIG. 10), as follows. First, the bottom surface of each clamp shoe 50 is placed on the rim 76 of the collar 72, as illustrated in FIG. 7, with the clamp shoes 50 located in diametrically-opposed relationship to each other on opposite sides of the collar 72. Next, the turnbuckle 60 is rotated typically in the counterclockwise direction as illustrated in FIG. 6 to simultaneously advance the shafts 58 from the respective ends thereof and thus, advance the shaft nuts 64 against the respective clamp plates 34. Consequently, as each clamp plate 34 pivots on the corresponding rod attachment bolt 68 from the relaxed position of FIG. 7 to the tensioned position of FIG. 8, each clamp shoe 50 moves toward the body edge 82 on the body 74 of the collar 72. The arcuate groove 56 of each clamp shoe 50 receives the congruent body edge 82, as illustrated in FIG. 8, and conterclockwise rotation of the turnbuckle 60 is continued until the clamp shoes 50 of the respective clamp plates 34 firmly engage diametrically-opposed portions of the body edge 82, as illustrated in FIGS. 9 and 10. Accordingly, the clamp shoes 50 grip the body edge 74 with sufficient firmness to facilitate grasping of the turnbuckle 60 and lifting of the turnbuckle 60 and clamp 32 to remove the collar 72 from the chamber interior 90. The collar 72 is removed from the clamp 32 by rotating the turnbuckle 60 typically in the clockwise direction, and this action retracts the shafts 58 into the respective ends of the turnbuckle 60 and relaxes the tension of the clamp shoes 50 against the body edge 82 of the collar 72, enabling the clamp shoes 50 to disengage the body edge 82 as illustrated in FIG. 7 and thus, remove the clamp 32 from the collar 72. The collar 72 is replaced in the chamber interior 90, as needed, by re-engaging the clamp shoes 50 with the body edge 82 of the collar 72 by counterclockwise rotation of the turnbuckle 60; lowering the collar 72 back into place in the chamber interior 90; and disengaging the clamp shoes 50 from the collar 72 by clockwise rotation of the turnbuckle 60.

While the preferred embodiments of the invention have been described above, it will be recognized and understood that various modifications may be made in the invention and the appended claims are intended to cover all such modifications which may fall within the spirit and scope of the invention.

Having described our invention with the particularity set forth above, we claim:

1. A clamp for engaging and lifting an article, comprising:
    a connecting rod;
    a pair of clamp plates pivotally carried by said connecting rod for engaging respective sides of the article;
    a clamp shoe carried by each of said pair of clamp plates for contacting the article, said clamp shoe having a groove for receiving the article; and
    a pivoting mechanism engaging said pair of clamp plates for pivoting said pair of clamp plates on said connecting rod and facilitating engagement and disengagement of said clamp shoe with the article.

2. The clamp of claim 1 wherein said pivoting mechanism comprises a turnbuckle and a pair of shafts extending from respective ends of said turnbuckle and engaging said pair of clamp plates, respectively.

3. The clamp of claim 1 wherein said clamp shoe comprises polytetrafluorethylene.

4. The clamp of claim 3 wherein said pivoting mechanism comprises a turnbuckle and a pair of shafts extending from respective ends of said turnbuckle and engaging said pair of clamp plates, respectively.

5. A method of removing a cathode collar from an HDP deposition chamber, comprising the steps of:
    providing a clamp comprising a connecting rod, a pair of clamp plates pivotally carried by said connecting rod and a pivoting mechanism engaging said pair of clamp plates for pivoting said pair of clamp plates on said connecting rod;
    positioning said pair of clamp plates on opposite sides of the cathode collar;
    causing engagement of said clamp plates with the cathode collar by operating said pivoting mechanism to pivot said pair of clamp plates on said connecting rod; and
    removing the cathode collar by raising said clamp.

6. The clamp of claim 5 wherein said pivoting mechanism comprises a turnbuckle and a pair of shafts extending from respective ends of said turnbuckle and engaging said pair of clamp plates, respectively.

7. The clamp of claim 6 further comprising a clamp shoe carried by each of said pair of clamp plates for contacting the cathode collar.

8. The method of claim 5 further comprising a clamp shoe carried by each of said pair of clamp plates for contacting the cathode collar.

9. The clamp of claim 8 wherein said clamp shoe comprises polytetrafluorethylene.

10. The clamp of claim 9 wherein said pivoting mechanism comprises a turnbuckle and a pair of shafts extending from respective ends of said turnbuckle and engaging said pair of clamp plates, respectively.

11. The clamp of claim 8 further comprising a substantially arcuate groove provided in said clamp shoe for receiving the cathode collar.

12. The method of claim 11 wherein said clamp shoe comprises polytetrafluorethylene.

13. The method of claim 11 wherein said pivoting mechanism comprises a turnbuckle and a pair of shafts extending from respective ends of said turnbuckle and engaging said pair of clamp plates, respectively.

14. The method of claim 13 wherein said clamp shoe is constructed of polytetrafluorethylene.

* * * * *